(12) United States Patent
Lenz

(10) Patent No.: US 6,671,329 B1
(45) Date of Patent: Dec. 30, 2003

(54) POWER AMPLIFIER

(75) Inventor: Helmut Lenz, Oberasbach (DE)

(73) Assignee: Siemens Aktiengesellschaft, Münich (DE)

( * ) Notice: Subject to any disclaimer, the term of this patent is extended or adjusted under 35 U.S.C. 154(b) by 0 days.

(21) Appl. No.: 09/457,856

(22) Filed: Dec. 10, 1999

(30) Foreign Application Priority Data

Dec. 14, 1998 (DE) .......................... 198 57 524

(51) Int. Cl.⁷ .......................... H04K 1/02; H04L 25/03; H04L 25/49
(52) U.S. Cl. .......................... 375/297; 375/238; 330/10
(58) Field of Search .............................. 375/297, 238; 330/146, 251, 10, 207 A, 175, 176; 332/109, 110, 111

(56) References Cited

U.S. PATENT DOCUMENTS 4,673,887 A * 6/1987 Atherton ...................... 330/10
5,991,179 A 11/1999 Schweighofer
6,118,337 A * 9/2000 Schweighofer .............. 330/10

* cited by examiner

*Primary Examiner*—Phoung Phu
(74) *Attorney, Agent, or Firm*—Schiff Hardin & Waite

(57) ABSTRACT

A power amplifier, particularly a gradient amplifier of a magnetic resonance tomography apparatus, has at least one switched output stage containing a power bridge circuit formed by a number of switch elements and connected to a floating intermediate circuit voltage, as well as at least one digital pulse width modulator that generates pulse-width-modulated control signals for all switch elements from a digital input signal in order to generate at least one output stage voltage according to an output stage switch clock. The digital pulse width modulator is preceded by a premodulator for forming the digital input signals, with at least one of the digital input signals containing an offset, preferably corresponding to half an LBS.

14 Claims, 15 Drawing Sheets

POWER AMPLIFIER

BACKGROUND OF THE INVENTION

1. Field of the Invention

The present invention is directed to a power amplifier of the type having at least one switched output stage with a power bridge circuit formed by switch elements connected to a floating intermediate circuit voltage, as well as with at least one digital pulse width modulator that generates pulse-width-modulated control signals for all of the switch elements of the power bridge circuit from digital input signals in order to generate an output stage voltage according to an output stage switch clock.

2. Description of the Prior Art

In power amplifiers of this type, high powers must be regulated with extreme accuracy. This is particularly the case for gradient amplifiers in a magnetic resonance tomography apparatus. The same is true, for example, in inductive heating devices in x-ray units or for the drive control of electric motors.

In a gradient amplifier, an alternating current on the order of magnitude of ±300 V given a current on the order of magnitude of 300 A is generated with a power bridge circuit. The power amplifier must exhibit such high precision that the current flow for each of the three gradient coils can be set in the mA range. The turn-on phases of the individual switch elements in the power bridge circuit, which are essentially defined by the output stage switch clock or clocks, must therefore be capable of being essentially continuously varied as to their respective time duration. For this reason, pulse width modulators of gradient amplifiers have conventionally been implemented in purely analog fashion, in order to allow the switching times of the switch elements, which, for example, can be power transistors, to be controlled as finely as desired.

Particularly power amplifiers having a number of switched output stages require a high component outlay due to the corresponding number of analog pulse-width modulators and also require correspondingly complicated electrical connections since, in this case, a number of phase-shifted delta-shaped voltages are required. The required, high number of components in the known power amplifiers leads to a correspondingly large structural volume as well as to correspondingly high manufacturing costs.

German Patent 197 09 767 discloses a method for operating a power amplifier of the above-described type with a number of switched output stages wherein the pulse-width-modulated control signals are cyclically exchanged between the switched output units. As a result, a good distribution of energy that, for example, is fed back to a load, is achieved among all switched output stages without requiring special discharge or energy distribution means between the switched output stages.

A power amplifier of the type initially described is disclosed, for example, in U.S. Pat. No. 4,673,887. A digital pulse width modulator has, as the basic components for generating pulse-width-modulated control signals, a clock generator, a clock divider as well as at least one shift register. The clock divider generates an on/off pulse sequence from a clock signal of the clock generator, this on/off pulse sequence being supplied to the shift register. The shift register is fashioned such that a phase relation of the on/off pulse sequence can be shifted. The pulse-width-modulated control signals are ultimately formed from a logic operation of the phase-shifted on/off pulse sequence with the non-phase-shifted on/off pulse sequence.

The control of the digital pulse width modulator ensues via digital input signals that, for example, are supplied to the shift register. The digital input signals are formed from an analog input signal by an analog-to-digital converter that precedes the digital pulse width modulator.

The aforementioned power amplifier is inflexible in accommodating changing demands as to resolution of the amplifier output voltage. A more highly resolvable amplifier output voltage requires a digital pulse width modulator, particularly a shift register having a greater bit width, as well as an analog-to-digital converter having a greater bit width. In particular, the use of a shift register having a greater bit width involves complicated modification of the entire pulse width modulator and is correspondingly cost-intensive.

SUMMARY OF THE INVENTION

It is therefore an object of the present invention to provide a power amplifier of the type initially described wherein the aforementioned disadvantages of the prior art are alleviated.

This object is inventively achieved in a power amplifier according to the switch behavior of the digital pulse width modulator simulates the switch behavior of an analog pulse width modulator. The generated output stage voltages thus have a substantially analog curve, i.e. an analog curve or a nearly analog curve.

Inventively, a pre-modulator precedes the digital pulse width modulator, a prescribable number of input signals for the digital pulse width modulator being initially supplied thereto. Subsequently, the output signals formed in the pre-modulator can be supplied to the digital pulse width modulator as input signals.

By employing a pre-modulator, the resolution of the pulse-width-modulated control signals is greatly improved. The inventive power amplifier thus delivers exact output stage switch clocks, so that the current flux generated in the inductive load that is across at the outputs of the power amplifier exhibits a high precision. The inventive power amplifier is thus ideally employable for operating gradient coils in a magnetic resonance tomography apparatus.

The digital pulse width modulator utilized in the inventive power amplifier has a significantly smaller structural size compared to an analog pulse width modulator. The inventive power amplifier thus requires less installation space.

In an embodiment the resolution of the output signals of the digital pulse width modulator by push-pull dithering or, respectively, by isoclock dithering.

In a preferred embodiment of the invention, at least two switched output stages are series-connected at the output side so that the power amplifier has an output voltage that corresponds to the sum of these output stage voltages. In a further version, all switched output stages can be driven with switch signals that are offset relative to one another. As a result of this measure, the maximum output voltage as well as the effective switching frequency are multiplied by a factor that generally corresponds to the number of switched output stages.

By employing a number of switched output stages, the cost/power relationship is further improved, since, in addition to the economic, digital pulse width modulators, the individual switched output stages from which the power amplifier is constructed need not satisfy any particularly high demands and are thus more economic than a single, high-performance switched output stage. The advantages of inexpensive power transistors, which might otherwise be unsuited because they have a slow switching behavior, (for example, IGBTs, insulated gate bipolar transistors) can also be exploited. Moreover, due to the low switching frequency of the individual switched output stages, significantly lower losses occur.

In preferred embodiments, an odd numbered plurality of switched output stages is used. The phase angle of the output stage switch clock signals preferably is to 360°/k, wherein k is the number of switched output stages.

A uniform division of the overall load among the individual switched output stages preferably ensues. The switched output stages can, in particular, contribute to the output voltage of the power amplifier in equal parts and/or in a symmetrical fashion. For example, the switched output stages can be driven such that they supply voltage pulses of identical width.

Given an output voltage of 2000 V, a voltage boost of 400 V is obtained given, for example, five identical switched output stages, and thus a lower ripple is obtained at the output of the power amplifier despite a maximum output power of 2000 V.

In a preferred embodiment of the inventive power amplifier, two voltage pulses are generated in each switched output stage in each cycle of the output stage switch clock, each of these being separated by a free-running mode. The two voltage pulses can be produced by a diagonal operation of the power bridge circuit, and the two free-running modes can each correspond to a condition of the power bridge circuit wherein a load current can flow unimpeded through the power bridge circuit.

DESCRIPTION OF THE DRAWINGS

FIGS. 2a–2e show the various switch statuses of the switched output stage according to FIG. 1 given current built-up and when holding current.

DESCRIPTION OF THE PREFERRED EMBODIMENTS

Figure 1:
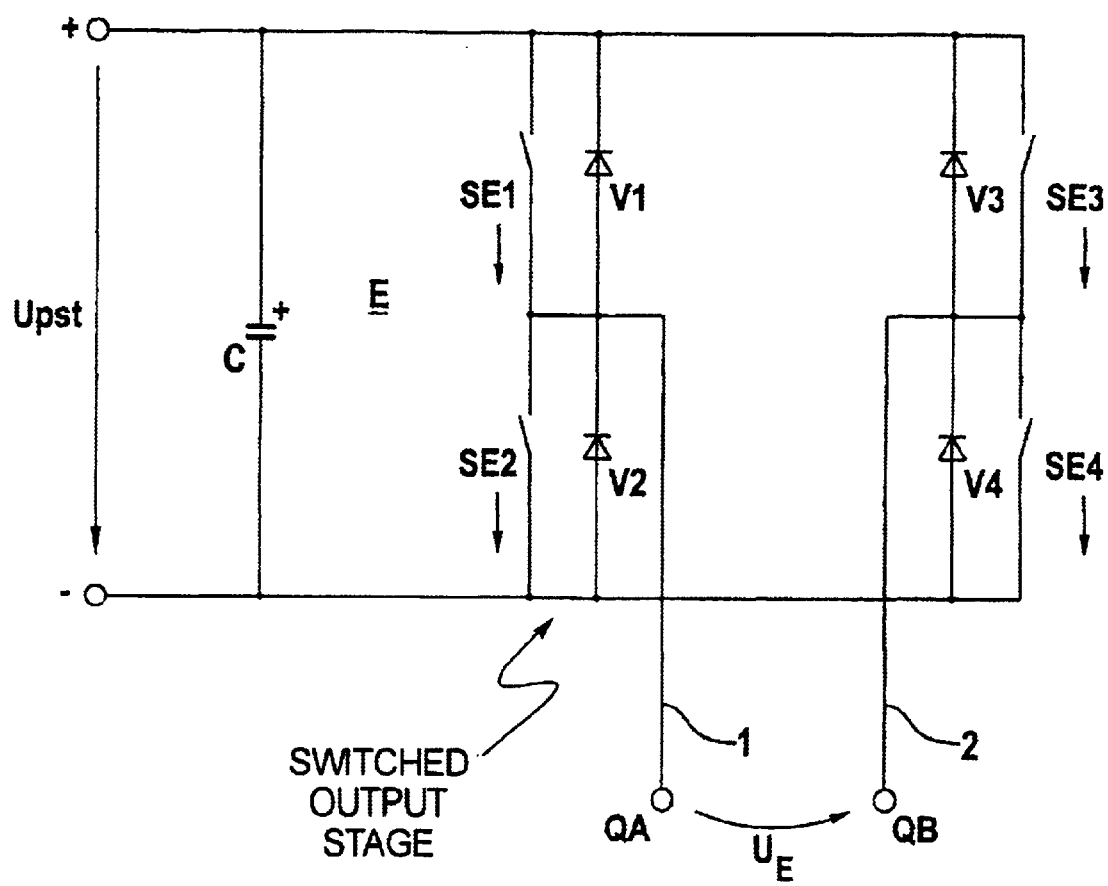
FIG. 1 is a circuit diagram of a switched output stage in accordance with the invention.
Figure 5:
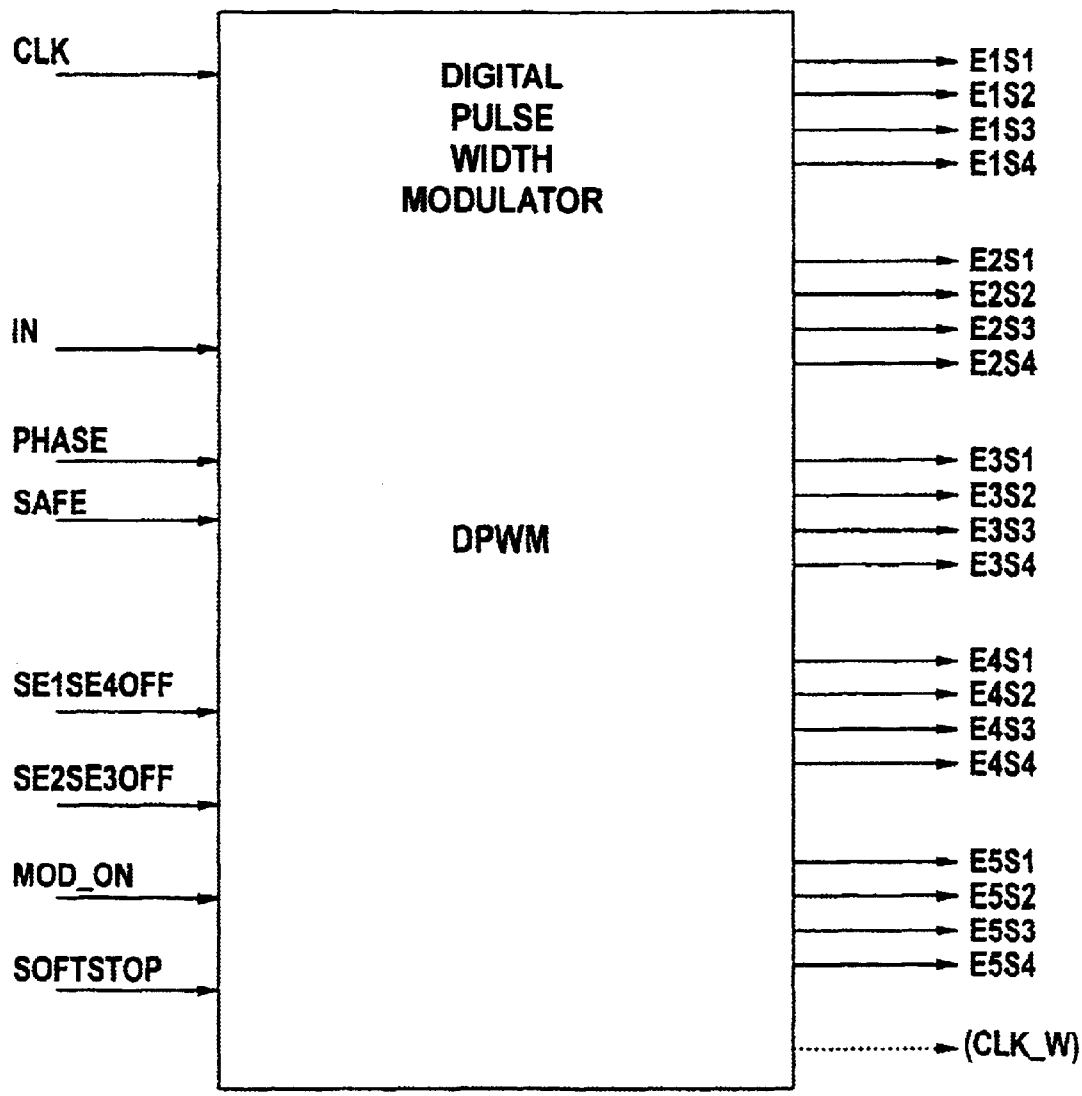
FIG. 5 is a schematic illustration of a digital pulse width modulator that is suitable for an inventive power amplifier.

The switched output stage E shown in FIG. 1 has a power bridge circuit that is connected to a floating supply voltage Upst. The power bridge circuit has four switch elements SE1 through SE4 arranged in respective arms of an H-bridge that respond to pulse-width-modulated control signal of a digital pulse width modulator DPWM (FIG. 5). The switch elements SE1 through SE4 are, for example, implemented as MOS-FET transistors or as bipolar transistors with unbiased diodes. Respective pairs of the switch elements SE1 and SE3, and SE2 and SE4, are connected to the positive and negative terminals of a supply voltage Upst. The remaining terminals of the respective pairs of switch elements (SE1 and SE2 or SE3 and SE4) are connected in pairs to one another and to respective connecting lines 1 and 2. The connecting line 1 leads to the output QA of the switched output stage E, and the connecting line 2 leads to the output QB of the switched output stage E. Respective unbiased diodes V1 through V4 are connected in parallel with the switch elements SE1 through SE4, with opposite polarity. A capacitor C buffers the floating supply voltage Upst, resulting in an intermediate circuit voltage across the power bridge circuit.

The outputs QA and QB of the switched output stage E are connected to a primarily inductive load L, for example to a gradient coil (see FIGS. 2a through 2d and FIGS. 3a through 3d).

For building up the current and holding the current, the switch elements SE1 through SE4 of the switched output stage E according to FIG. 1 assume the switch statuses shown in FIGS. 2a through 2d. The current flux, which always flows from the output QA across the inductive load L to the output QB of the switched output stage E, is shown with broken lines in FIGS. 2a through 2d.

Figure 2A:
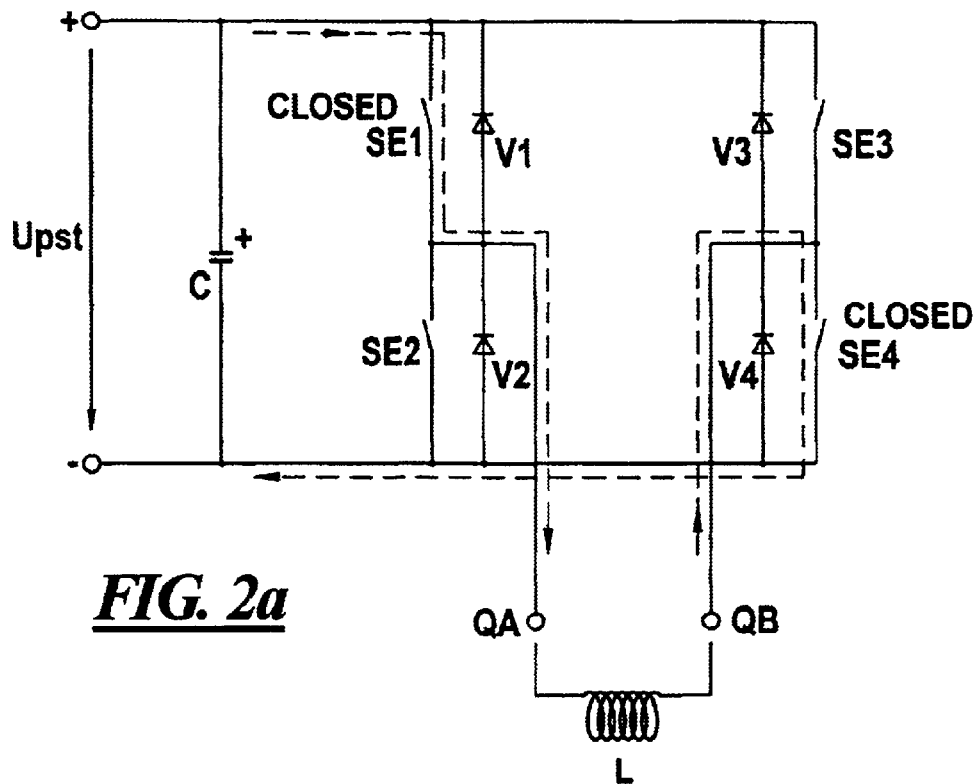

When the switch elements SE1 and SE4 are closed as in FIG. 2a, the current flows from the positive supply voltage side through the switch element SE1 into the inductive load L and through the switch element SE4 to the negative terminal of the supply voltage Upst. Energy is taken from the intermediate circuit (capacitor C). The output QA of the switched output stage E is positive compared to the output QB of the switched output stage E. The switched output stage E is thus in the "first diagonal mode".

Figure 2B:
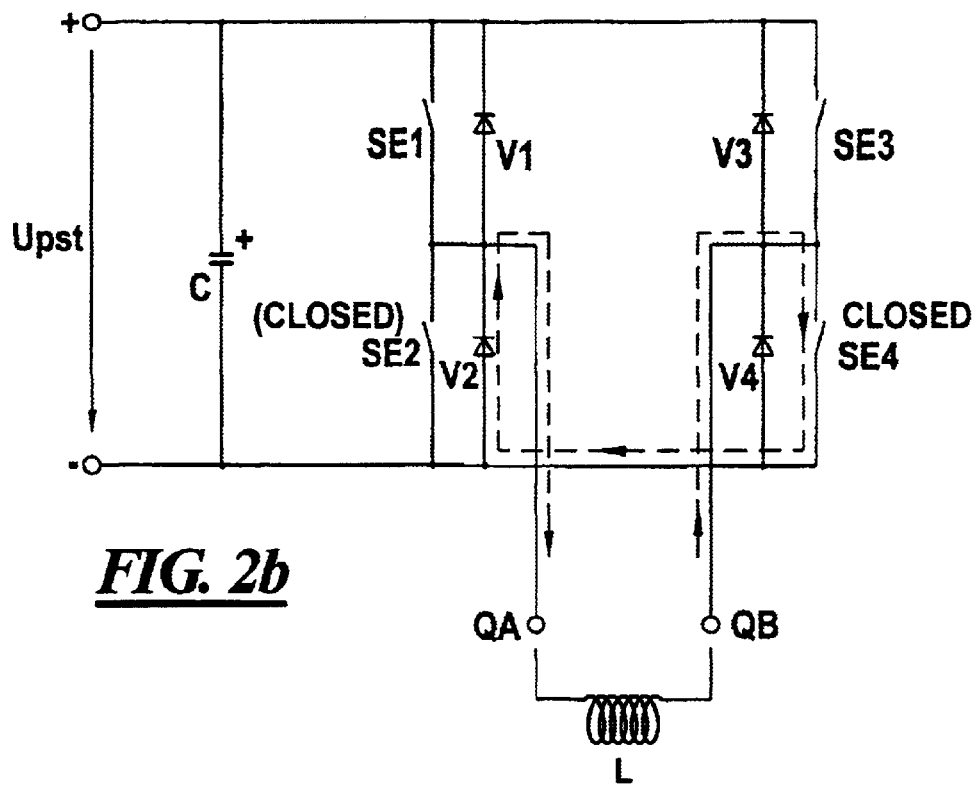

Given the switch status according to FIG. 2b, the switch element SE4 is closed, and the switch element SE2 can be switched on or off. The current flows in the switched output stage E from the output QB through the switch element SE4 and the diode V2 to the output QA of the switched output stage E. When the switch element SE2 is a MOSFET and is conducting, the switch element SE2 can accept a part of the diode current of the diode V2. The output QB of the switched output stage E is then minimally positive compared to the output QA. The switch status of the switched output stage E shown in FIG. 2b is referred to as "lower free-running mode".

Figure 2C:
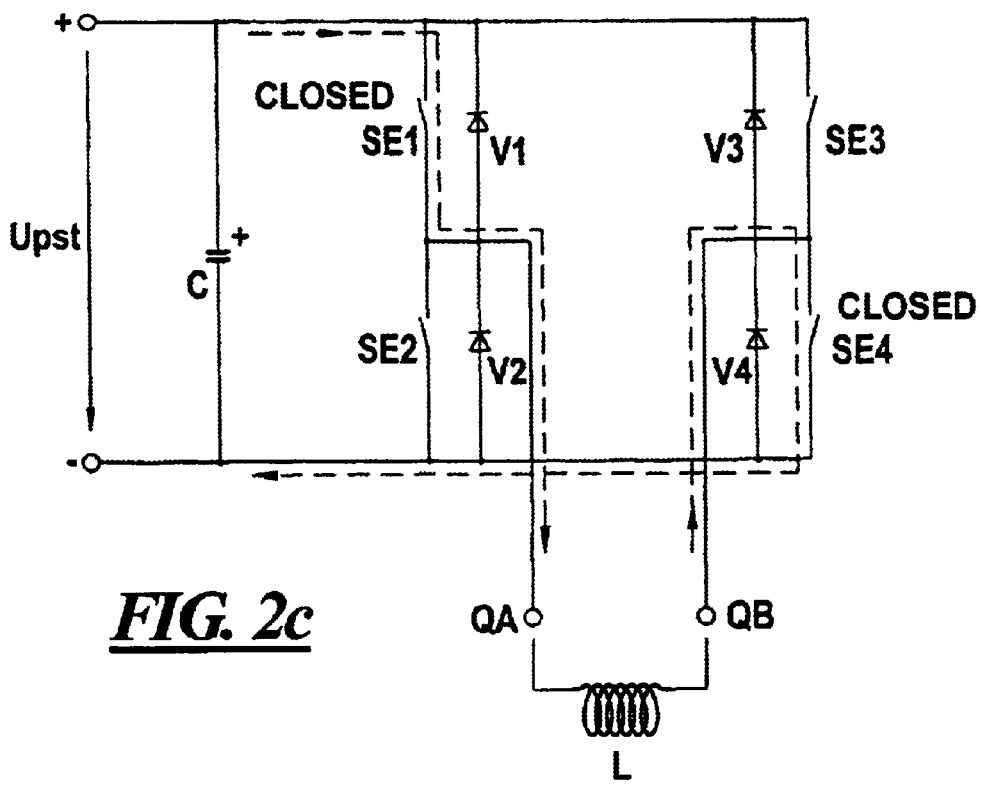
Figure 2B:
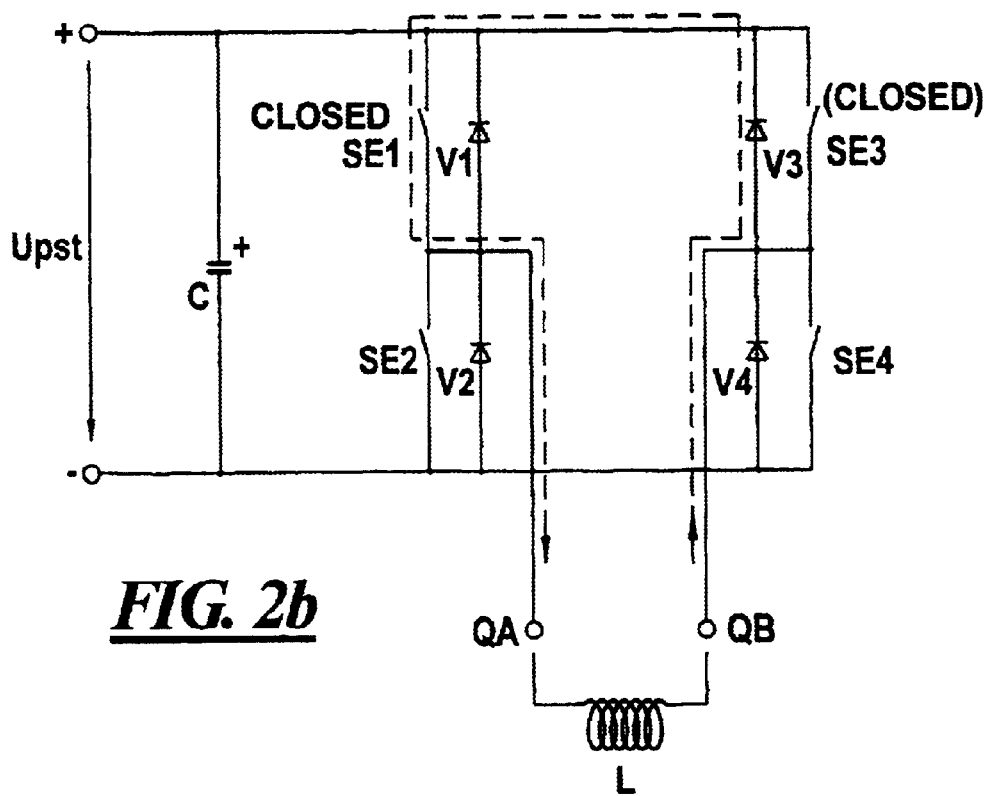

The status of the switch elements SE1 through SE4 shown in FIG. 2c corresponds to the status of the switch elements SE1 through SE4 in FIG. 2a and is therefore again referred to as "first diagonal mode".

Given the status of the switch elements SE1 through SE4 shown in FIG. 2d, the switch element SE1 is conducting, the switch element SE3 can be conducting but need not be, and the switch elements SE2 and SE4 are open. The current flows in the switched output stage E from the output QB through the diode V3 and the switch element SE1 to the output QA of the switched output stage E. When the switch element SE3 is a MOSFET, the switch element SE2 can assume a part of the diode current of the diode V3. The switch status shown in FIG. 2 is referred to as "upper free-running mode".

Figure 2E:
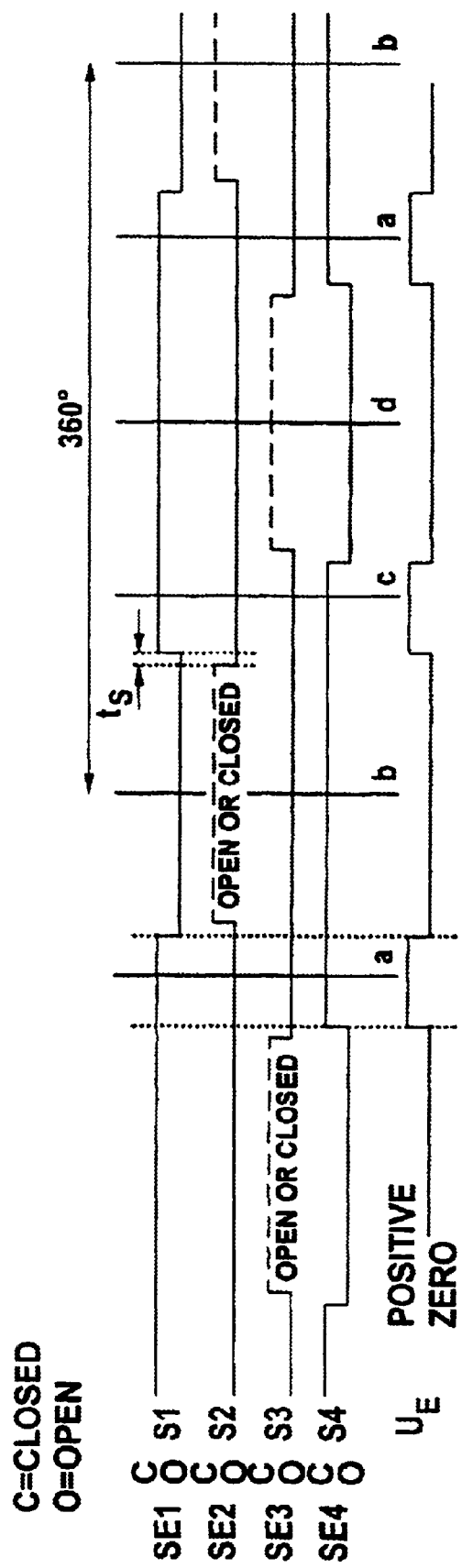

In FIG. 2e, the pulse-width-modulated control signals S1 through S4, with which the digital pulse width modulator DPWM drives the switch elements SE1 through SE4 are shown for the operating conditions of the switched output stage E shown in FIGS. 2a through 2d. The output stage voltage $U_E$ (voltage between the outputs QA and QB of the switched output stage E) is shown at the bottom in FIG. 2e. The brief time offset in the drives of the switch elements SE1 through SE4 represents a safe time $t_S$ since the switch elements SE1 and SE2, or SE3 and SE4, must never be simultaneously activated. The operating instances shown in FIGS. 2a through 2d are referenced with the letters a through d.

FIGS. 3a through 3d show the switch statuses of the switched output stage E illustrated in FIG. 1 given current dismantling in the inductive load L (gradient coil) due to counter-voltage. Energy is thereby returned from the gradient coil L into the intermediate circuit (capacitor C). The current flux is again shown with broken lines.

Figure 3A:
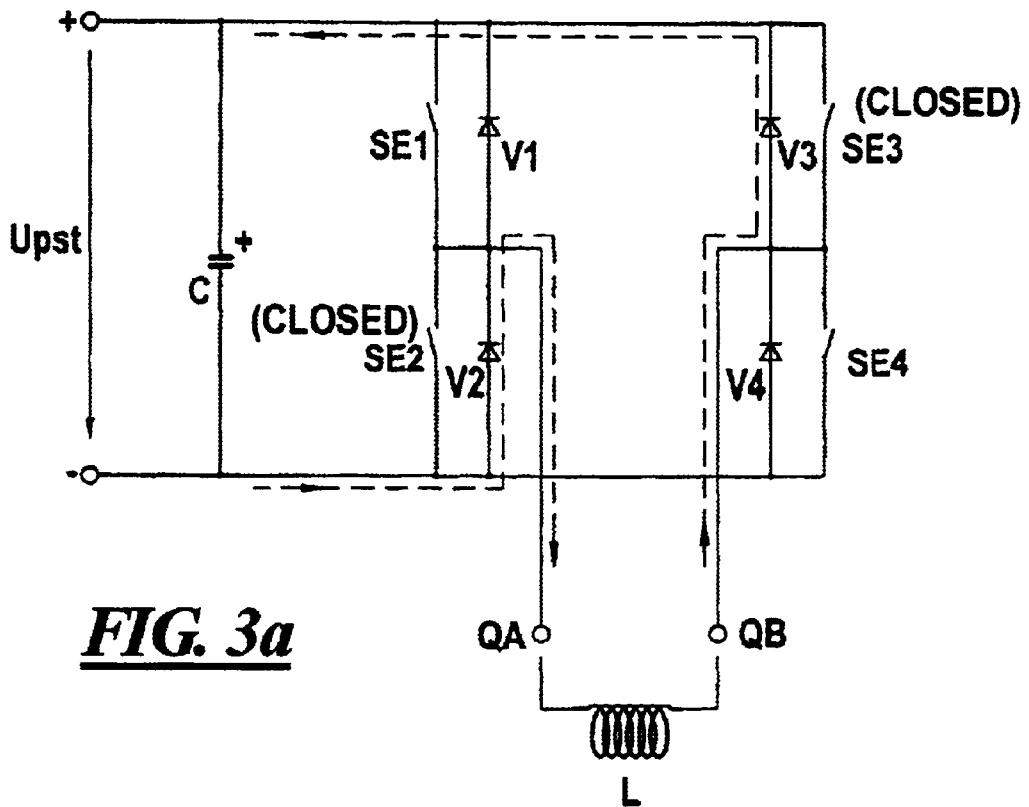
FIGS. 3a–3e show the various switch statuses of the switched output stage according to FIG. 1 given current dismantling.

The current flux shown in FIG. 3a is obtained when the switch elements SE1 and SE4 are open. The switch elements SE2 and SE3 can but need not be closed. The current flows from the negative supply voltage side through the diode V2 into the inductive load L and from the output QB of the switched output stage E through the diode V3 to the positive terminal of the supply voltage Upst. Energy is thus supplied back into the intermediate circuit (capacitor C). The output QB of the switched output stage E is positive compared to the output QA of the switched output stage E.

Figure 3B:
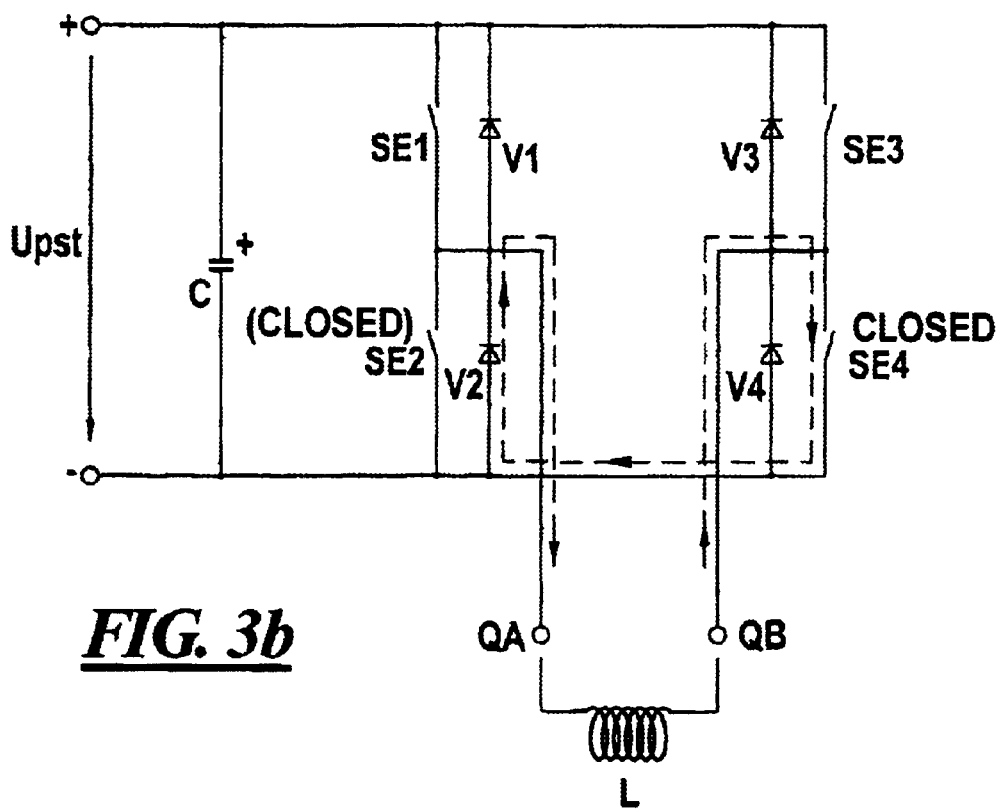

In FIG. 3b, the switch element SE4 is closed and thus the switch element SE2 can but need not be activated. The switch elements SE1 and SE3 are open. The current thus flows from the output QB of the switched output stage E through the switch element SE4 and the diode V2 to the output QA of the switched output stage E (lower free-running mode).

Figure 3C:
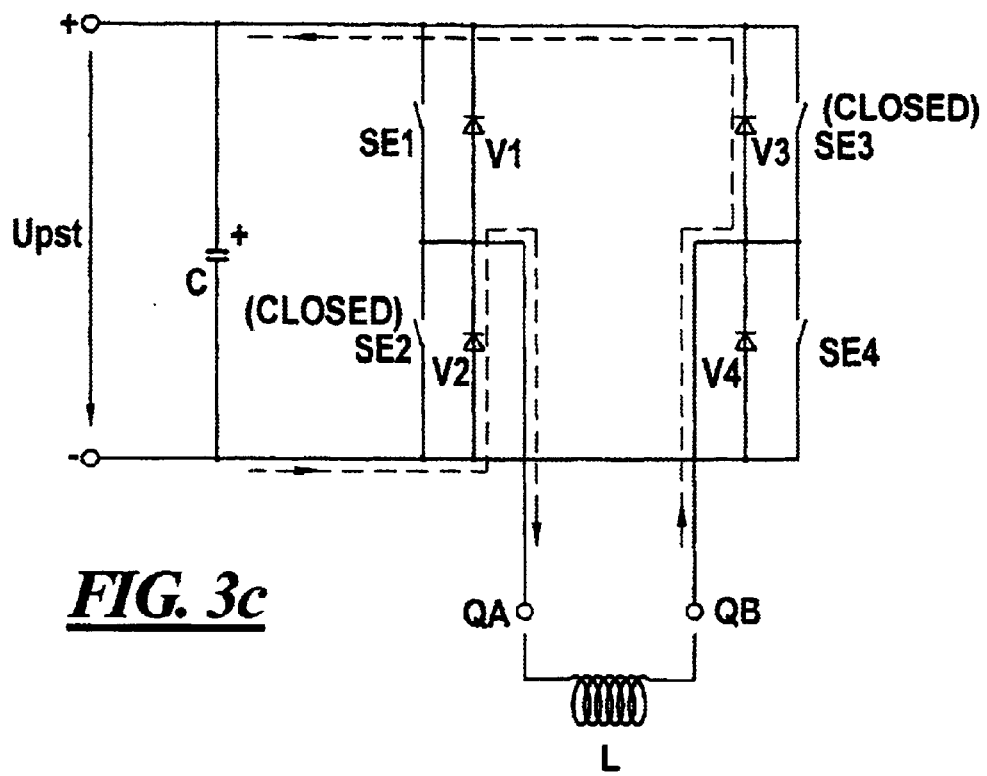

The switch status of the switched output stage E shown in FIG. 3c corresponds to the switch status shown in FIG. 3a.

Figure 3D:
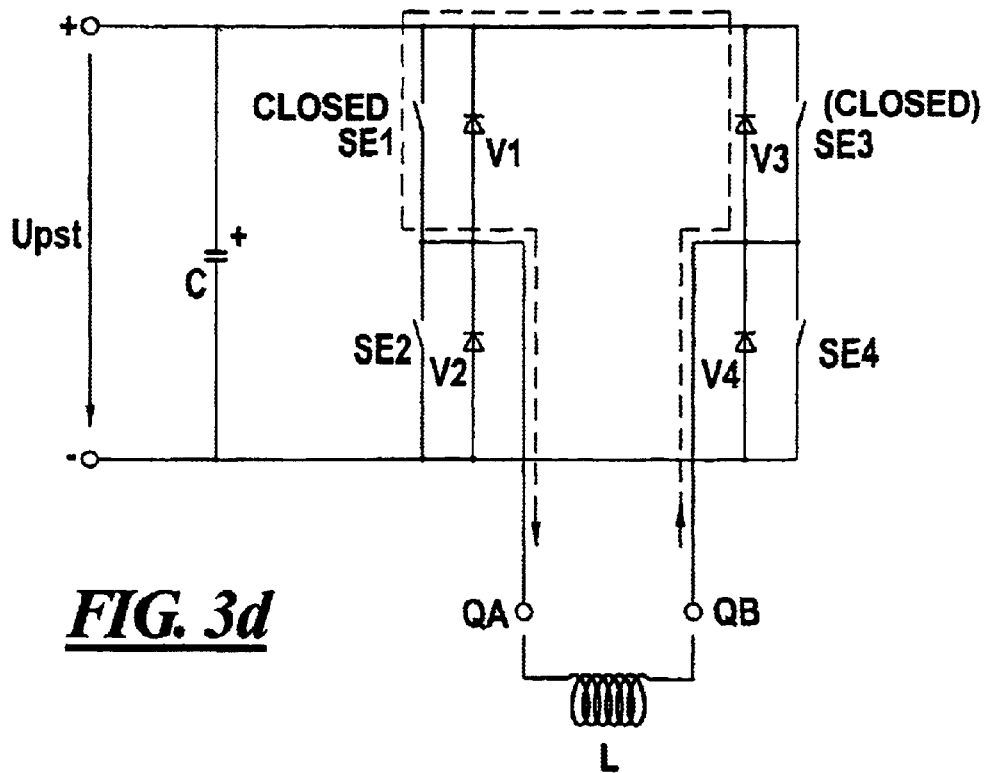

The current flux shown in FIG. 3d is achieved by the switch element SE1 being closed and the switch elements SE2 and SE4 being open. The switch element SE3 can but need not be closed. The current thus flows back from the output QB of the switched output stage E through the diode V3 and the switch element SE1 to the output QA of the switched output stage E (upper free-running mode).

Figure 3E:
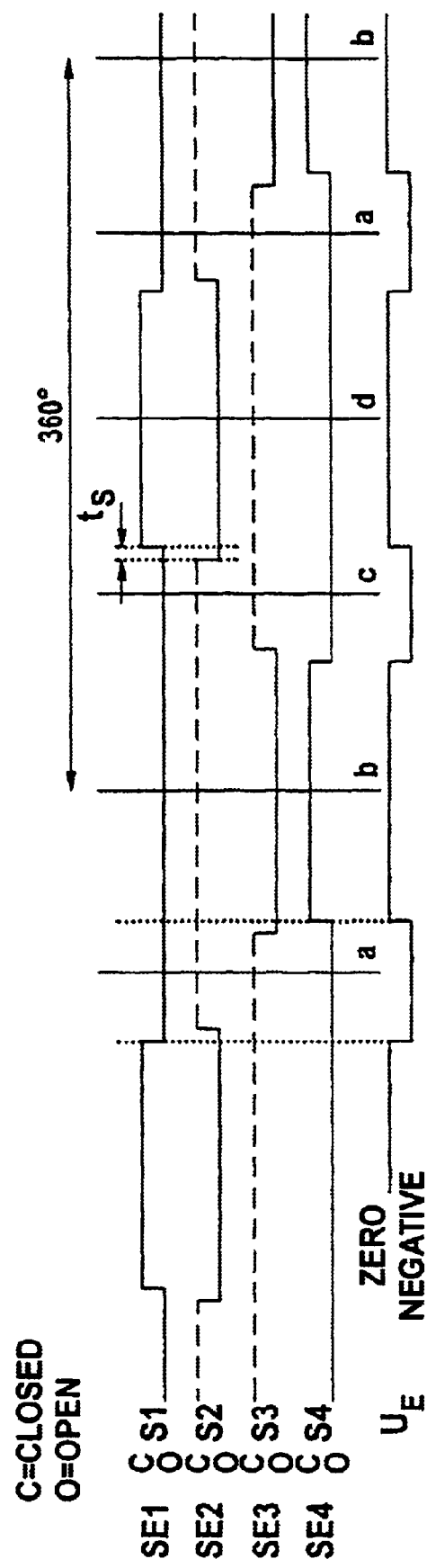

The switch statuses of the switch elements SE1 through SE4 shown in FIGS. 3a through 3b are achieved by the pulse-width-modulated control signals S1 through S4 shown in FIG. 3e, whereby the output stage voltage $U_E$ (voltage between the outputs QA and QB of the switched output stage E) shown at the bottom in FIG. 3e arises. The on durations of the switch elements SE1 and SE4 are shorter here than the on durations shown in FIG. 2e. In this example, the input signals of the digital pulse width modulator DPWM from which the pulse-width-modulated control signals S1 through S4 for all switch elements SE1 through SE4 of the power bridge circuit are generated, thus would be smaller.

The switch statuses given the opposite current direction are not shown; they correspond analogously to FIGS. 2 and 3, whereby the switch element SE1 is assumed to be interchanged with the switch element SE3 and the switch element SE2 is assumed to be interchanged with the switch element SE4.

The modulation shown in FIGS. 2a through 2e as well as 3a through 3e is significantly more advantageous compared to a known, simpler modulation that is not shown. Given this known, simpler modulation, the switch elements SE1 and SE4 and subsequently, the switch elements SE2 and SE3 are activated in sequence. Due to the lack of the upper free-running mode and of the lower free-running mode in such conventional operation, the full output stage voltage $U_E$ (output voltage of the switched output stage E) is always across the inductive load L, leading to an extremely high current ripple.

Figure 4:
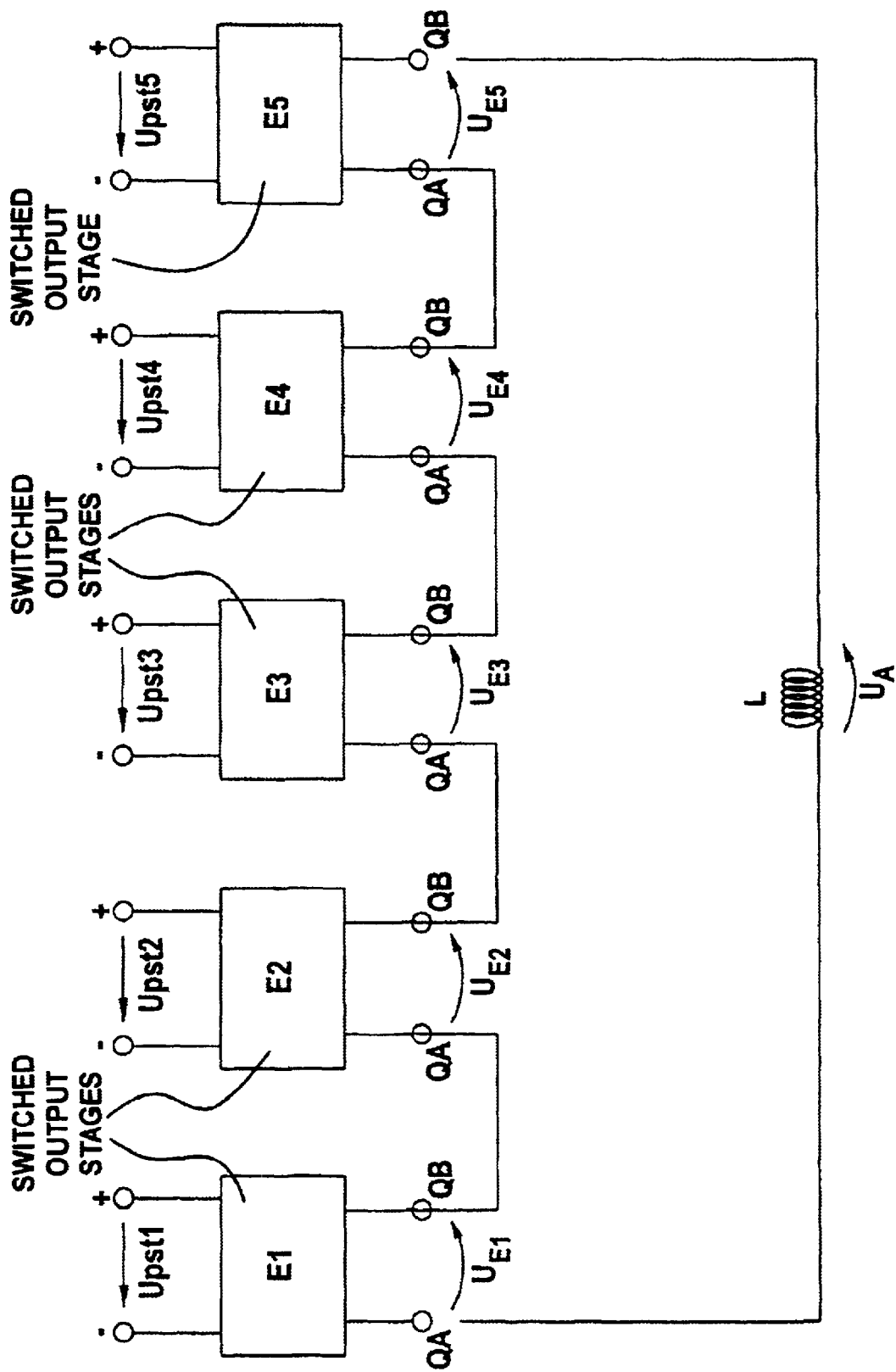
FIG. 4 is a schematic circuit diagram of a power amplifier having five switched output stages in accordance with the invention.

FIG. 4 shows a series circuit (cascading) of (in this exemplary embodiment) five switched output stages E1 through E5. The switched output stages E1 through E5 are supplied respectively by floating supply voltages Upst1 through Upst5. The five switched output stages E1 through E5 are identically constructed and correspond to the switched output stage E described in FIG. 1. The pulse-width-modulated control signals S1 through S4 for the switched output stages E1 through E5 (output signals of the digital pulse-width modulator DPWM) correspond to the pulse-width-modulated control signals S1 through S4 from FIGS. 2e and 3e. The pulse-width-modulated control signals S1 through S4 for each switched output stage E1 through E5 are respectively shifted by 360°/5=72° relative to one another given a switching cycle of 360°. The output voltage $U_A$ of the power amplifier is thus the sum of the output stage voltages $U_{E1}$ through $U_{E5}$.

The embodiment of the inventive digital pulse width modulator DPWM shown schematically in FIG. 5 generates the respective pulse width modulated control signals S1 through S4 required forth switch elements SE1 through SE4 from an input signal IN for producing five switched output signals E1 through E5. As an example reference E3S2 denotes that the pulse-width-modulated control signal S2 forth switch element SE2 in the switched output stage E3 is present at this output of the digital pulse width modulator DPWM. The reference E1S4, for example, denotes the analogous case that the switch element SE4 of the switched output stage E1 is driven via this output with its pulse-width-modulated control signal S4.

For determining the input signal IN, the digital pulse width modulator DPWM generates the A/D converter clock CLK-W.

The input signal IN satisfies the condition that the pulse width for a lower limit value in its value range amounts to zero percent of a switching period duration, by contrast whereto the pulse width amounts to 100% given an upper limit value of its value range. The input signal IN can be a digital word, for example from a digital regulator, or an analog regulator or control signal that is converted into a digital value via an analog-to-digital converter.

The input signal IN is several bits wide and determines the pulse-width-modulated control signals S1 through S4 of the digital pulse width modulator DPWM.

Given the digital pulse width modulator DPWM shown in FIG. 5, it is taken into consideration as an option that the switch elements SE1 through SE4 that are respectively not needed for the current conduction with a given current direction, are not activated, i.e. remain open. Given the current directions defined in FIGS. 2a through 2d as well as 3a through 3d, these are always the switch elements SE2 and SE3. This is taken into consideration by the two shutoff signals SE1SE4OFF and SE2SE3OFF that can be supplied to the digital pulse width modulator at the input side. When, thus, the shut off signal SE1SE4OFF is supplied to the digital pulse width modulator DPWM, then the switch elements SE1 and SE4 are blocked in their open position, by contrast to which the two switch elements SE2 and SE3 remain in the open condition when the shut off signal SE2SE3OFF is present. The shut off signals SE1SE4OFF and SE2SE3OFF are HIGH signals in the exemplary embodiment.

The phase offset desired given the series circuit of five switched output stages E1 through E5 shown in FIG. 4 is taken into consideration by the phase signal PHASE in the digital pulse width modulator DPWM according to FIG. 5.

The signal SAFE determines the duration of the safe time $t_S$. The signal MOD_ON enables the outputs of the digital pulse width modulator DPWM. The shut off signal SOFT-STOP effects a shut off of the output stage voltages $U_{E1}$ through $U_E$ by driving a free-running circuit, and thus a soft shut off of the output voltage $U_A$ of the power amplifier. As a result, nerve stimulation of the patient due to an excessively large change in magnetic field is reliably prevented.

If the safe time $t_S$ shown in FIGS. 2e and 3e is left out of consideration, then the drive of the switch element SE2 is inverse to the drive of the switch element SE1, and the drive of the switch element SE4 is inverse to the drive of the switch element SE3. The on duration of the switch element SE3 decreases to the same extent as, given an increasing input signal, the on duration of the switch element SE1 increases. The behavior of the switch element SE3 thus corresponds to the switch behavior of the switch element SE1 with a reversed (inverted) input signal.

Figure 6:
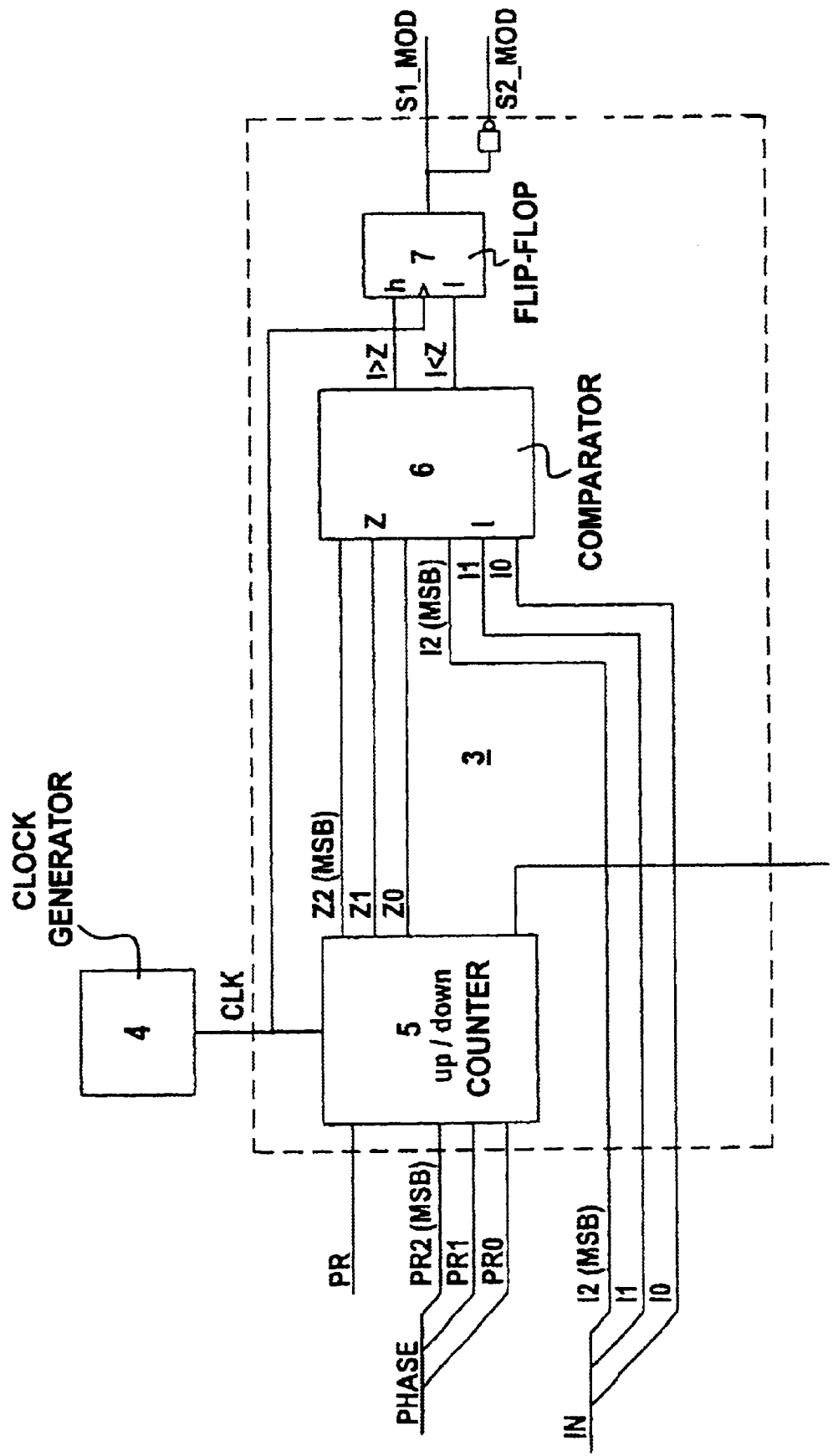
FIG. 6 shows a modulator basic element of an inventive pulse width modulator.

FIG. 6 shows a simple modulator base element 3 having a width of 3 bits. It is supplied with a clock signal CLK by a clock generator 4 and is composed of a 3-bit counter 5 that automatically counts up and down, i.e. from "000" to "111" and from "111" back to "000". The input signal IN likewise has a width of 3 bits. The input signal IN, which can assume the values I0, I1, I2, and the counter reading Z, that can assume the values Z0, Z1, Z2, are supplied to a comparator 6 and are compared to one another therein. The comparator 6 has two outputs I>Z and I<Z. When the input signal IN is greater than the counter reading Z, then the output I>Z is set to "HIGH"; when the input signal IN is smaller than the counter reading Z, then I<Z is set to "HIGH". The two comparator signals I>Z and I<Z are supplied to a flip-flop 7 whose output QFF—given a positive signal edge of the clock signal CLK—is set to "HIGH" by the comparator signal I>Z and is set to "LOW" by the comparator signal I<Z. A LOW level at the two inputs of the flip-flop 7 represents the memory condition. The counter 5 as functions initially not employed, as an output NULL that is set to HIGH when the counter reading Z is "000", the counter 5 counts up and the clock signal CLK is HIGH at the moment. The counter 5 also has a pre-load input PR and a 3-bit data input for the phase signal (digital word "PHASE") with the pre-load data PR2 (most significant bit MSB) and PR1 as well as PR0. When the pre-load input is HIGH, then the period data are taken as a new counter reading Z and the counter 5 is set in the direction "count up".

The inverted input signal N_IN, which can assume the values N_I0, N_I1, N_I2, is supplied to a second comparator 62 together with the counter reading Z, the outputs thereof switching the second flip-flop 72 back and forth. The output of the first flip-flop 71 corresponds to the drive of the switch element SE1 (output signal S1_MOD); the drive of the switch element SE2 is inverted relative thereto (inverted output signal S2_MOD). The output of the second flip-flop 72 corresponds to the drive of the switch element SE3 (output signal S3_MOD). The drive of the switch element SE4 is inverted relative thereto (inverted output signal S4_MOD). The designation "_MOD" indicates that a signal is one of the output signals of the modulator base element 9. Safe times $t_S$ are still lacking.

As explained in the description of FIG. 2e, the pulse widths generated by the switch elements SE2 and SE3 behave inversely proportional to the pulse widths generated by the switch elements SE1 and SE4 dependent on the input signal IN. When, given maximum input signal IN, the switch elements SE1 and SE4 are constantly closed, then the switch elements SE2 and SE3 should be constantly opened. When the input signal IN is in the middle of its value range, then the switch elements SE1 and SE4 should not be simultaneously closed but the switch elements SE1 and SE3 should. Likewise, the switch elements SE2 and SE4 should be simultaneously closed. The drive of the switch element SE4 thus corresponds to the drive of the switch element SE1; however, it is offset by half an output stage switch clock. The same is true of the switch elements SE2 and SE3.

This switch behavior can be achieved by modifying the simple modulator base element 3 according to FIG. 6, by inverting either the counter reading Z or the input signal IN. Since the counter 5 works with the highest clock rate, it is more advantageous—as shown in FIG. 8—to invert the input signal IN to form the word N_IN (inverted input signal).

Figure 7:
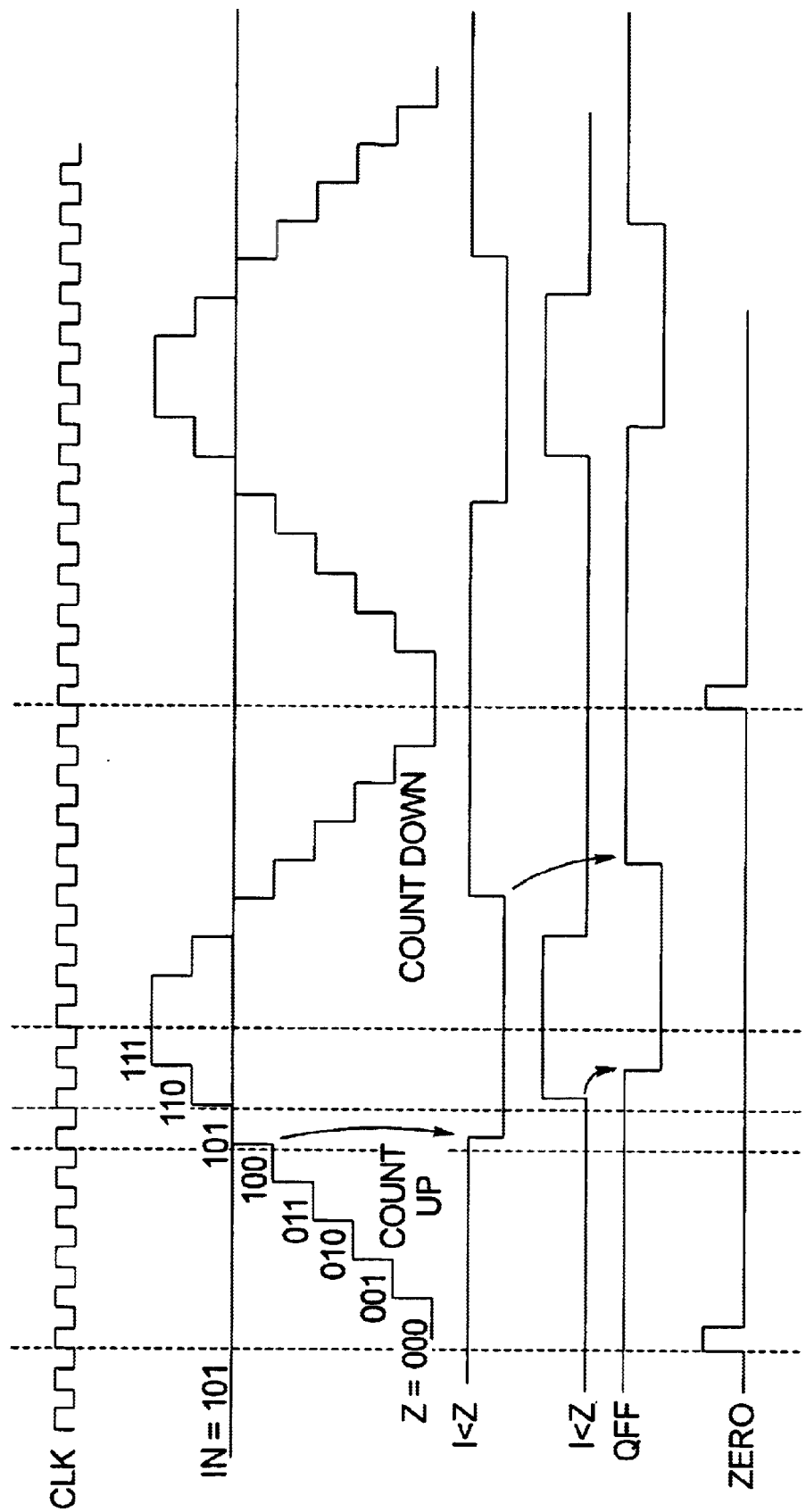
FIG. 7 illustrates the switch behavior of the modulator basic element according to FIG. 6.

FIG. 7 shows the pulse diagram of the modulator base element 9 according to FIG. 6. As the comparator threshold, the inverted input signal N_IN value "010" is included in the counter reading Z in addition to the input signal IN (value "101"). The signals of the second comparator 62 represent the comparison of the counter reading Z to the inverted input signal N_IN. The signals S1—MOD through S4_MOD are a matter of the output signals of the modulator base element 9 that are present at the outputs of the first flip-flop 71 or the second flip-flop 72, respectively.

Adherence to a safe time $t_S$ is generally needed in the drive for protecting each switched output stage E1 through E5. To this end, the drive to switch on each and every switch element SE1 through SE4 on is delayed at all switched output stages E1 through E5, but the drive for shut-off is not delayed.

The digital input signal IN as well as the inverted digital input signal N_IN are a criterion for the pulse width of the pulse-width-modulated control signals S1 through S4. In the case of a digital default, a "synchronizing" of the data is necessary, so that a data change does not accidentally occur during a clock edge. The synchronizing can occur by transferring the data into an input memory. The input memory is written when the input data are stable and a suitable clock edge is present.

When the pulse widths are prescribed in analog fashion, then these are converted by analog-to-digital converters (ADCs) into the digital words IN and N_IN. So that the input data are stable, it is advantageous for the converter clock of the analog-to-digital converters to be derived from the clock signal CLK of the digital pulse width modulator DPWM by a frequency divider and for the converter data to be written into the input memory with a clock edge.

One analog-to-digital converter fundamentally suffices, this generating the input signal IN. The inverted input signal N_IN is acquired from the input signal IN by inversion (see FIG. 6). When an inverted analog input signal N_IN_ana is available in addition to an analog input signal IN_ana, two analog-to-digital converters can be provided. The first analog-to-digital converter is for the analog input signal IN_ana and the second analog-to-digital converter is for the inverted analog signal N_IN_ana.

In the modulator base element 9 described in FIG. 6, only a width of three bits was assumed for easier comprehension. The resolution given a more realistic applied example is examined below. The clock signal CLK that is made available to the digital pulse width modulator DPWM by the clock generator 4 amounts, for example, to 40.96 MHZ. The bit width n of the counter 5 should be ten, and the supply voltage Upst should amount to 500 V. The switching frequency of the output stage E is established by $$f(CLK)/(2*2^n)=40.96 \text{ MHZ}/2048=20 \text{ kHz}.$$

For the following consideration, the inverted input signal N_IN is acquired from the input signal IN by inversion.

The output stage can emit positive and negative output voltages as outputs. The output stage voltage $U_E$ thus amounts to a maximum of +Upst through −Upst. The voltage boost of the output stage voltage $U_E$ thus amounts to 2*Upst=1000 V.

The input signal IN, and thus the pulse width of the drive signals, can assume $2^n$ different statuses. The resolution of the output stage voltage given the assumed bit width of n=10 thus amounts to $$dUmin=2*Upst/2^n=1000 \text{ V}/1024=0.9766 \text{ V}.$$

Given a series circuit of k=5 output stages, the following applies for the resolution:

$$dUmin=k*2*Upst/2^n=5*2*Upst/2^n=5000 \text{ V}/1024=4.883 \text{ V}.$$

When the inductive load L is a gradient coil that has a resistance of only approximately 0.1Ω, dc discontinuities of approximately 49 A arise in this case; however, a resolution in the mA range would be needed.

In order to achieve the required resolution in the mA range given a digital pulse width modulator, inventively the digital pulse width modulator DPWM is preceded by a pre-modulator at its input side.

Three alternatives for improving the resolution of the output signals of the digital pulse width modulator DPWM are described below, whereby the pre-modulator that employed in at least one of these three alternatives is supplied with analog input signals.

Figures 8A, 8B:
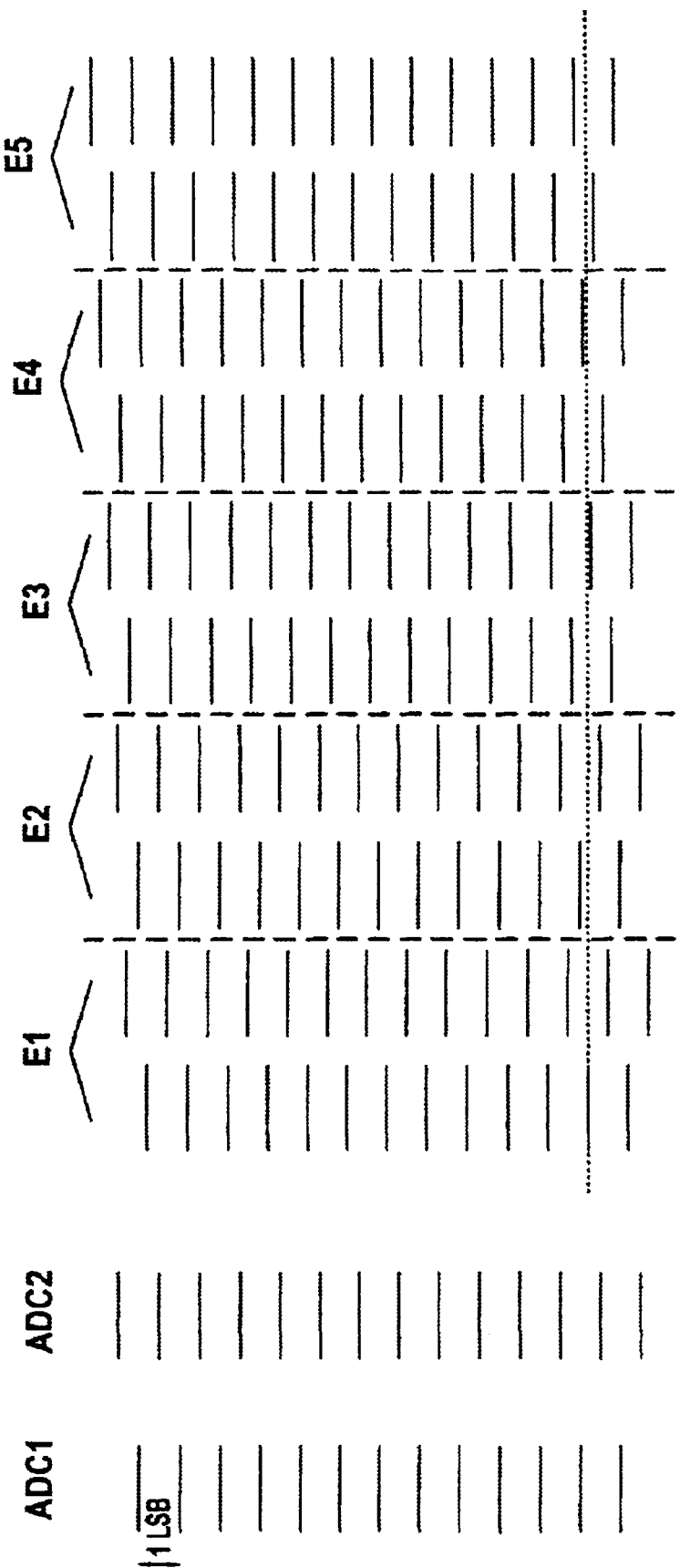
FIGS. 8a and 8b show the quantization stages that can be achieved with a first embodiment of a pre-modulator according to the invention.

The first of the three alternatives, wherein the number of input signals IN and N_IN is increased by offset graduation, is explained on the basis of FIGS. 8a and 8b.

The digital input signal IN and the inverted, digital input signal N_IN are acquired from analog input signal IN_ana and N_IN_ana, respectively. The analog input signal IN_ana is supplied to a first analog-to-digital converter ADC1. The inverted, analog input signal N_IN_na, which was acquired by analog inversion of the analog input signal IN_ana, is supplied to a second analog-to-digital converter ADC2. The inverted, digital input signal N_IN thus no longer corresponds to an input signal IN that is digitally inverted (i.e. bit-by-bit), since the offset of the second analog-to-digital converter ADC2 (or of the input signal N_IN_ana inverted analog) is shifted by half an LSB (least significant bit) (see FIG. 8a). It is basically of no consequence whether the offset of the first analog-to-digital converter ADC1 or of the second analog-to-digital converter ADC2 is shifted.

When the analog input signal IN_ana, or the inverted, analog input signal N_IN_ana, changes, then the quantization stages (conversion stages) of the analog-to-digital converters ADC1 and ADC2 are achieved at different signal levels. When the analog input signal IN_ana reaches a quantization stage, then the inverted, analog input signal N_IN_ana reaches the next quantization stage by the amount of 0.5 LSB later (corresponding to an analog signal). Accordingly, the pulse-width-modulated control signals S1 and S2 for the switch elements SE1 and SE2 as well as the pulse-width-modulated control signals S3, S4 for the switch elements SE3 and SE4 are no longer modified at the same values of the analog input signal IN_ana, but instead are modified in alternation. Given an increasing analog input signal IN_na, for example, the pulse width of the pulse-width-modulated control signals S1 and S2 is modified first; the pulse width of the pulse-width-modulated control signals S3 and S4 follow and these are in turn followed by the pulse width of the pulse-width-modulated control signals S1 and S2, etc.

As can be seen from FIG. 8a, the converter stages of the first analog-to-digital converter ADC1 (generates the digital input signal IN) and the converter stages of the second analog-to-digital converter ADC2 (generates the inverted, digital input signal N_IN) are offset by 0.5 LSB relative to one another. It can be seen from FIG. 8b that the converted stages of the five output stages E1 through E5 are respectively offset relative to one another by 0.2 LSB.

Given the quantization stages of the two analog-to-digital converters shown in FIG. 8a, the resolution is thus twice as good:

$$dUmin=2*Upst/(2\times2^n)=5*100 \text{ V}/2*1024)=2441 \text{ V}.$$

Given a series circuit having k =5 output stages with a total of two analog-to-digital converters ADC1 and ADC2, the following applies:

$$dUmin=k*2*Upst/(2*2^n)=5*1000 \text{ V}/(2*1024)=2.441 \text{ V}$$

When, however, not all k =5 inputs for the digital input signal IN and not all k=5 inputs for the inverted, digital input signals N_IN are connected, but instead each signal is separately determined with its own analog-to-digital converter, then the resolution given the offset shift of the conversion stages shown in FIG. 8b amounts to $$dUmin=k*2*Upst/(k*2*2^n)=5*1000 \text{ V}/(5*2*1024)=0.488 \text{ V}.$$

Given a series circuit of k=5 output stages E1 through E5, thus, the resolution of a single output stage is also achieved. However, 2*k analog-to-digital converters must be installed for this purpose, i.e. one analog-to-digital converter for each output stage and one for each analog input signal IN_ana and N_IN_ana.

Since the analog-to-digital converters cannot be more precisely matched to one another, this offset shift will not be able to be maintained over the entire conversion range. When the inductive load L is a gradient coil, i.e. the power amplifier is a gradient amplifier, however, very small output voltages $U_A=U_{E1}+U_{E2}+U_{E3}+U_{E4}+U_{E5}$ already suffice for holding the current since primarily an inductive load. It is thus adequate when the offset shift is adequately exact only in the proximity of the output stage output voltage $U_A$ equal to zero.

Figure 9:
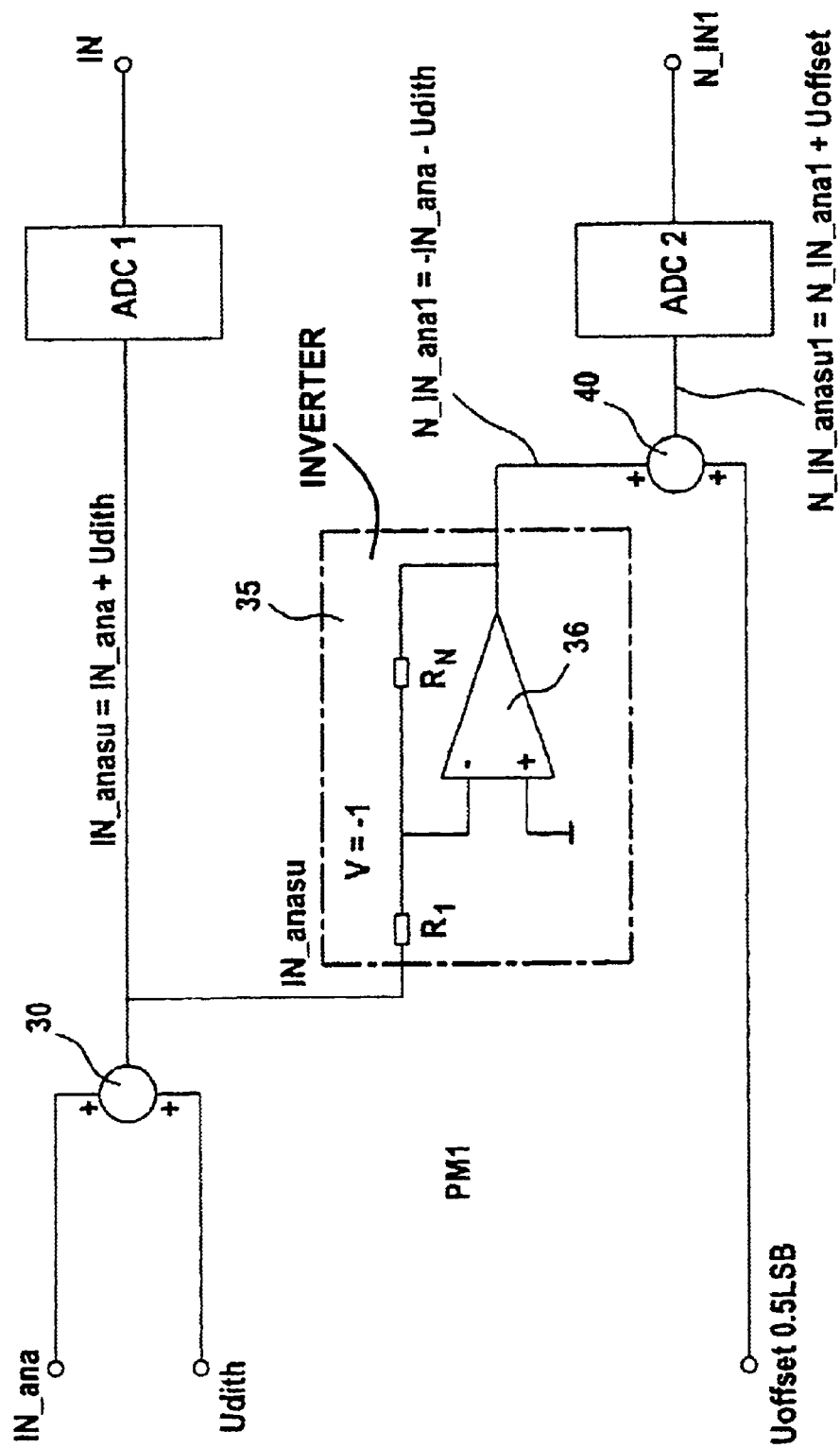
FIG. 9 shows a second embodiment of a pre-modulator according to the invention.

Push-pull dithering, which is explained with reference to FIG. 9, is a second possibility for improving the resolution of the output signals of the digital pulse width modulator DPWM.

An analog input signal IN_ana, a dither signal Udith and an offset signal Uoffset are supplied to the pre-modulator P1 illustrated in FIG. 9. The analog input signal IN_ana and the dither signal Udith, which is likewise a matter of an analog signal, are forwarded to a summation unit 30. In summation unit 30, an analog sum input signal IN_anasu=IN_ana+

Udith is formed from the analog input signal IN_ana and from the dither signal Udith, this sum input signal being supplied to a first analog-to-digital converter ADC1.

The analog sum input signal IN_anasu is simultaneously supplied to an inverter 35. The inverter 35 includes an operational amplifier 36 and two series-connected resistors $R_1$ and $R_n$. The non-inverting input, (plus sign) of the operational amplifier 36 is connected to ground, and the inverting input (minus sign) of the operational amplifier 36 is connected to the resistor $R_1$.

An inverted, analog input signal N_IN_ana1=-IN_ana-Udith is formed (gain V=-1) in the operational amplifier 36 from the analog sum input signal IN_anasu. The inverted, analog input signal N_IN_ana1 is supplied to a summation unit 40. The offset signal Uoffset is also supplied to the summation unit 40. An inverted, analog sum input signal N_IN_anasu1 =N_IN_ana1+Uoffset=-IN_ana-Udith+Uoffset, which is supplied to a second analog-to-digital converter ADC2, is formed in the summation unit 40 from the inverted, analog input signal N_IN_ana1 and the offset signal Uoffset.

A digital input signal IN for the digital pulse width modulator DPWM is formed in the first analog-to-digital converter ADC1 from the analog sum input signal IN_anasu. An inverted, digital input signal N_IN1, which is supplied as input signal N_IN to the digital pulse width modulator DPWM, is formed in the second analog-to-digital converter ADC2 from the inverted analog sum input signal N_IN_anasu1.

Given a dither signal Udith that is positive at the moment, the digital input signal IN becomes greater and the inverted, digital input signal N_IN1 becomes smaller, leading to a boost of the output voltage.

When a signal supplied to the first analog-to-digital converter ADC1 or to the second analog-to-digital converter ADC2 lies between the quantization stages (conversion stages) of the appertaining analog-to-digital converter, then the part of this signal that just exceeds the conversion stage does not contribute to the pulse width modulation of the control signals S1 through S4 for the switch elements SE1 through SE4. As a result of push-pull dithering, when thus a dither signal Udith (low alternating signal) is superimposed on the analog input signal IN_ana, the next conversion stages of the analog-to-digital converters ADC1, ADC2 may occasionally be reached. Reaching the next conversion level leads to the fact that the next stage of the pulse width to be reached in the pulse-width-modulated control signals S1 through S4, and thus the next stage of the appertaining output stage voltage $U_{E1}$ through $U_{E5}$ is reached at the appertaining output stage E1 through E5.

Averaged over a longer time, thus, values that correspond to a non-quantized drive are set for the pulse widths of the pulse-width-modulated control signals S1 through S4 of the appertaining output stge E1 through E5. The dither signal Udith is thereby selected with an amplitude that at least corresponds to an LSB step (least significant bit).

Figure 11A:
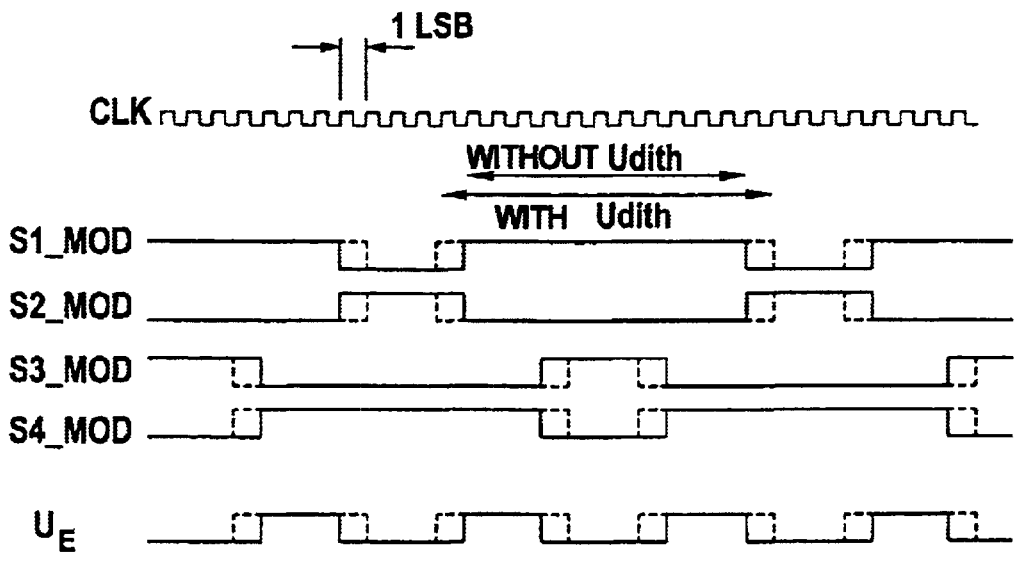
FIG. 11a illustrates the switch behavior of the digital pulse width modulator given a pre-modulator according to FIG. 9.

FIG. 11a shows the effects described above given the assumption that the dither signal Udith increases the pulse width by 1 LSB (i.e., 1 CLK) Per pulse edge in the signals IN and N_IN1. The solid line represents a pulse width without dither signal Udith; the modification of the signals IN and N_IN1 by the momentary value of the dither signal Udith is shown with broken lines (pulse width of the signals with dither signal Udith).

Whereas the sophistication of the transducer resolution by offset graduation (first alternative according to FIG. 8a and FIG. 8b for increasing the resolution of the pulse-width-modulated control signals S1 through S4) immediately leads to output stage voltages $U_{E1}$ through $U_{E5}$, the push-pull dithering takes effect averaged over a number of switch clocks. When, for example given a pulse-width-modulated control signal, the next-higher pulse width is achieved once but not three times in succession, then the next-higher pulse width is achieved once and is subsequently not achieved three times in succession, etc., then the output stage voltage $U_E$ is raised by an average of 0.25 of an LSB (smallest converter step, or smallest pulse width change in the pulse-width-modulated control signals S1 through S4 or resolution dUmin).

Due to the possible non-linearity of the analog-to-digital converters ADC1 and ADC2, the dither signal Udith is selected of a size of several LSB steps in specific applications. Given the push-pull dithering described in FIG. 9, this leads to the fact that, dependent on the dither signal Udith, a corresponding output voltage of the output stages E1 through E5 is generated. In order to minimize this, the third alternative shown in FIG. 10 can be used, referred to below as isoclock dithering.

The pre-modulator PM2 shown in FIG. 10 is again supplied with an analog input signal IN_ana, with a dither signal Udith, and with an offset signal Uoffset. The analog input signal IN_ana and the dither signal Udith, which is likewise a mater of an analog signal, are forwarded to a summation unit 45. In the summation unit 45, an analog sum input signal IN_anasu=IN_ana+Udith is formed from the analog input signal IN_ana and the dither signal Udith, this being supplied to the first analog-to-digital converter ADC1.

The analog input signal IN_ana is simultaneously supplied to an inverter 50. The inverter 50 again includes an operational amplifier 36 and two series-connected resistors $R_1$. and $R_N$. The non-inverting input (plus sign) of the operational amplifier 36 is connected to ground, and the inverting input (minus sign) of the operational amplifier 36 is connected to the resistor $R_1$.

An inverted, analog input signal N_IN_ana2 =-IN_ana is formed (gain V=-1) in the operational amplifier 36 from the analog input signal IN_ana. The inverted, analog input signal N_IN_ana2 is supplied to a summation unit 55. The dither signal Udith and the offset signal Uoffset are again supplied to the summation unit 55. An inverted, analog sum input signal N_IN_anasu2=-IN_ana+Udith+Uoffset, which is supplied to a second analog-to-digital converter ADC2, is formed in the summation unit 55 from the inverted, analog input signal N_IN_ana2, from the dither signal Udith and from the offset signal Uoffset.

A digital input signal IN for the digital pulse width modulator DPWM is formed in the first analog-to-digital converter ADC1 from the analog sum input signal IN_anasu. An inverted digital input signal N_IN2, which is supplied as input signal N_IN to the digital pulse width modulator DPWM, is formed in the second analog-to-digital converter ADC2 from the inverted analog, sum input signal N_IN_anasu2.

Figure 10:
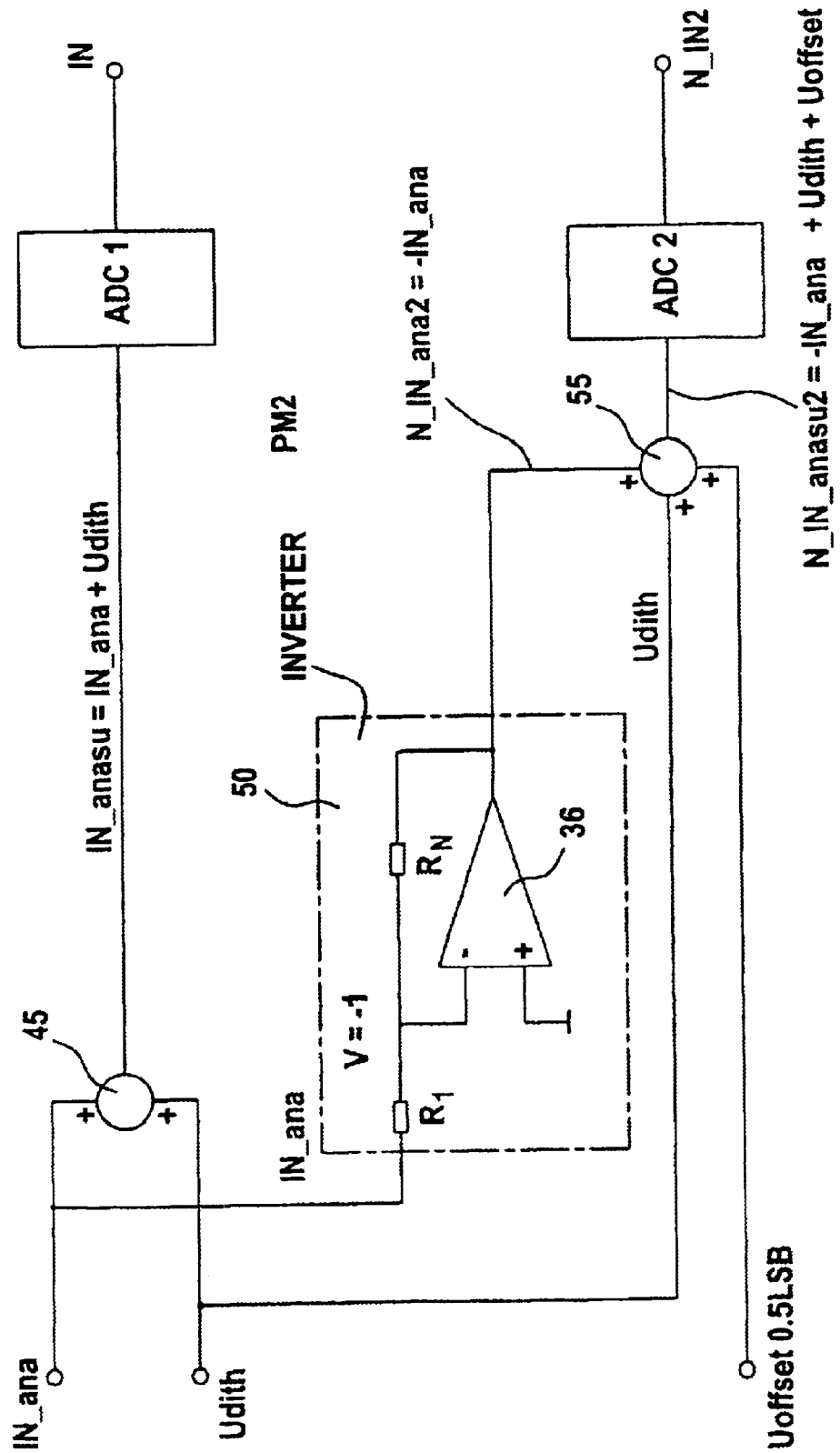
FIG. 10 shows a third embodiment of a pre-modulator according to the invention.

As can be seen from the explanations for the version according to FIG. 10, the analog-to-digital converters for the signal IN (ADC 1) and for the signal N_IN2 (ADC 2) need not be supplied with the same signal (inverted at N_IN2) since the supplied signal is only intended to enhance the resolution. The enhancement of the resolution likewise occurs when the dither signal Udith is supplied by adding it to IN_ana (as previously) and the dither signal Udith is not subtracted from N_IN_ana2, but is likewise added (see FIG. 9).

Figure 11B:
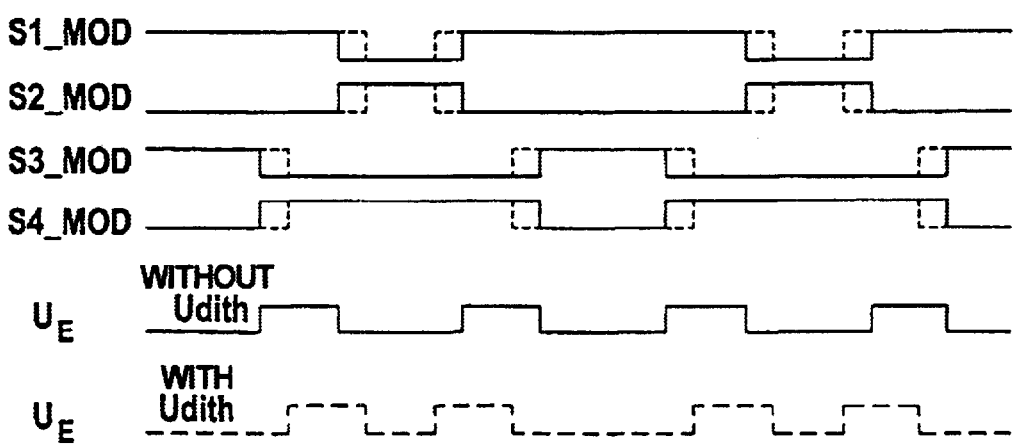
FIG. 11b illustrates the switch behavior of the digital pulse width modulator given a pre-modulator according to FIG. 10.

FIG. 11b shows that the on duration of the switch element SE1 is lengthened, as previously, and the on duration of the switch element SE4 decreases to the same extent. The pulses at the output voltage, which arise when the switch elements SE1 and SE4 are simultaneously activated, no longer occur at uniform intervals; instead, the output voltage has not changed on average over a switch period.

The maximum modification of the output stage voltage occurs when, due to the offset shift of two analog-to-digital converters, only one analog-to-digital converter changes in value. This corresponds to 0.5 LSB modulation. Accordingly, the dither signal Udith for common mode dithering can have a size of a number of LSB (theoretically, nearly arbitrarily); it begins to have a discernable effect only with a maximum of 0.5 LSB. The common mode dithering does not offer this advantage in the simple modulation (switch elements SE1 and SE4 closed), then switch elements SE2 and SE3 closed, then switch elements SE1 and SE4 closed again, etc.); push-pull dithering, of course, also takes effect here.

The version described in FIGS. 10 and 11b is referred to as "common mode dithering" because the on time durations of the upper and lower switch elements of a switch stage E shift such that a common mode voltage occurs at the output stage output.

Having at least two analog-to-digital converters is a pre-condition for common mode dithering, one for the digital input signal IN and one for the inverted, digital input signal N_IN2.

The peak-to-peak amplitude of the dither signal Udith should amount to at least one LSB; edge steepness and amplitude should not make it possible that the digital pulse width modulator DPWM is caused to flip back and forth.

As an example, the counter in the digital pulse width modulator DPWM is assumed to run from "000 . . . 00" to "111 . . . 11" in 25 $\mu$s. The full modulation of the analog input signal IN_anasu (ADC1) amounts to ±10 V. The limit of the edge steepness of the dither signal Udith thus amounts to 20 V/25 $\mu$s. When the dither signal Udith is faster, or steeper, given a corresponding amplitude, then it can intervene directly into the pulse width modulation.

The digital pulse width modulator DPWM reacts to the change of the signals IN and N_IN within a few CLK periods, i.e., in significantly less than 1 microsecond given clock signals CLK≧10 MHZ. The time bottleneck is the analog-to-digital converter. Given involvement of the digital pulse width modulator DPWM in an (analog) control circuit, conversion rates having, for example, 1 MHZ can be necessary so that the time delays do not become too large, thus degrading the control properties. In general, the conversion frequency should be at least twice as high as the output stage switching clock, since two pulses arise per output stage switch clock, that should thus be differently modulated.

Given a digital drive, the signals IN and N_IN are already present in digital form; they need not be acquired from an analog signal with analog-to-digital converters. Given a drive with, for example, a signal processor, the calculating resolution is select higher than the bit resolution of the digital pulse width modulator DPWM, so that the addition of an offset signal O corresponding to Uoffset, or a dither signal D corresponding to Udith, becomes possible.

The dither signal D corresponding to Udith can, for example, can be a simulated sign or delta function with a peak-to-peak amplitude, so that at least one LSB step of the digital pulse width modulator DPWM is reached. When "noise" is to be used as the dither signal, the dither signal can be generated by random numbers whose maximum size amounts to at least one modulator LSB.

When the calculated signal IN_re reaches its value range limits "000 . . . 00" or "11 . . . 11", then the addition of the offset signal Uoffset and the dither signal Udith can be omitted, so that a full modulation is possible.

A bit resolution of 10 bits xxx xxx xxx x for the digital pulse width modulator DPWM is assumed in the following example.

Let the calculated signal IN_re (14 bits) be 011 101 100 0 00 11 and let the momentary value of the dither signal D (14 bits) be 000 000 000 0 11 10.

The sum signal IN_SU_re (14 bits) from the calculated signal IN_re and the dither signal D is as 011 101 100 1 00 01.

The digital input signal IN then amounts to 011 101 100 1.

The input signal N_IN_re inverted relative to the calculated signal IN_re then assumes the value 100 010 011 1 11 00.

Given common mode dithering, the dither signal D amounts to 000 000 000 0 11 10 and the offset signal O amounts to 000 000 000 0 01 11.

The sum input signal N_IN_SU_re of the inverted, calculated input signal N_IN_re, the dither signal D and the offset signal O thus is as 100 010 100 1 00 01, so that the value 100 010 100 1 is obtained for the inverted input signal N_IN.

The sum input signals IN_SU_re and N_IN_SU re are to be limited to the range from "000 . . . 00" through "111 . . . 11", i.e. to the value range of IN_re.

Fundamentally, just as for an analog drive, thus, the improvements such as graduation by offset, push-pull dithering and common mode dithering are achievable given a purely digital drive.

Although modifications and changes may be suggested by those skilled in the art, it is the intention of the inventor to embody within the patent warranted hereon all changes and modifications as reasonably and properly come within the scope of his contribution to the art.

I claim:

1. A power amplifier comprising:
    a switched output stage containing a power bridge circuit formed by a plurality of switch elements connected to a floating intermediate circuit voltage;
    a pre-modulator which forms a plurality digital input signals from incoming signals, at least one of said digital input signals in said plurality being offset by at least a portion of a bit from at least one other of said digital input signals in said plurality; and
    a digital pulse width modulator, connected following said pre-modulator, which receives said plurality of digital input signals together from said pre-modulator and which generates pulse width modulated control signals therefrom for operating the respective switch elements to cause said switched output stage to generate an output stage voltage dependent on an output stage switch clock.

2. A power amplifier as claimed in claim 1 wherein said offset is half of an LSB.

3. A power amplifier as claimed in claim 1 wherein said incoming signals are analog signals and wherein said pre-modulator comprises:

a first analog-to-digital converter supplied with one of said analog signals, which forms a first of said digital output signals therefrom;

a second analog-to-digital converter supplied with another of said analog signals which forms a second of said digital input signals therefrom; and said first and second analog-to-digital converters being offset relative to each other with respect to a reference potential to produce an offset between said first of said digital output signals and said second of said digital output signals.

4. A power amplifier as claimed in claim 3 wherein said offset is half of an LSB.

5. A power amplifier as claimed in claim 1 wherein said incoming signals comprise analog signals, and wherein said pre-modulator comprises:

a first summing unit which forms an analog sum input signal from one of said analog input signals and a dither signal;

an inverter, supplied with said analog sum input signal, which forms an inverted, analog input signal therefrom;

a second summing unit which forms an inverted, analog sum input signal from said inverted, analog input signal and an offset signal representing said offset between said first of said digital input signals and said second of said digital input signals;

a first analog-to-digital converter which forms said first of said digital input signals from said analog sum input signal; and a second analog-to-digital converter which forms an inverted, digital input signal, as said second of said digital input signals, from said inverted, analog sum input signal.

6. A power amplifier as claimed in claim 1 wherein said incoming signals comprise analog signals, and wherein said pre-modulator comprises:

a first summing unit which forms an analog sum input signal from one of said analog input signals and a dither signal;

an inverter, supplied with said analog sum input signal, which forms an inverted, analog input signal therefrom;

a second summing unit which forms an inverted, analog sum input signal from said inverted, analog input signal, said dither signal, and an offset signal representing said offset between said first of said digital input signals and said second of said digital input signals;

a first analog-to-digital converter which forms said first of said digital input signals from said analog sum input signal; and a second analog-to-digital converter which forms an inverted, digital input signal, as said second of said digital input signals, from said inverted, analog sum input signal.

7. A power amplifier as claimed in claim 1 wherein said pre-modulator comprises a digital signal processor having a calculating resolution which is higher than a bit resolution of said digital pulse width modulator, and wherein said digital signal processor calculates a sum signal by addition of a reference value, calculated by said signal processor for a pulse width modulation, and a first offset signal, and said signal processor forming an inverted, calculated sum signal by addition of an inverted reference value and a second offset signal, said first and second offset signals having respective values so that a sum of said first and second offset signal comprises half of an LSB of said digital pulse width modulator, said calculated sum signals having a minimum when all bits are 0 and a maximum when all bits are 1, and wherein more significant bits of said calculated sum signal forms said first of said digital input signals and wherein more significant bits of said inverted calculated sum signal forms an inverted, digital input signal, as said second of said digital input signals.

8. A power amplifier as claimed in claim 7 wherein said signal processor forms said calculated sum signal by adding said reference value, said first offset signal, and a calculated dither function, and wherein said signal processor forms said inverted, calculated sum signal by adding said inverted reference value and said second offset signal and subtracting said calculated dither function.

9. A power amplifier as claimed in claim 7 wherein said signal processor forms said calculated sum signal by adding said reference value, said first offset signal, and a calculated dither function, and wherein said signal processor forms said inverted, calculated sum signal by adding said inverted reference value and said second offset signal and said calculated dither function.

10. A power amplifier as claimed in claim 1 wherein said switched output stage is a first switched output stage, and wherein said power amplifier comprises a plurality of further switched output stages connected in series with said first switched output stage, each of said first switched output stage and said further switched output stages respectively generating output stage voltages, said output stage voltages adding to form a total output voltage for said power amplifier.

11. A power amplifier as claimed in claim 10 wherein said first switched output stage and said plurality of further switched output stages comprise an odd number of switched output stages.

12. A power amplifier as claimed in claim 10 wherein the respective output stage voltages are substantially equal.

13. A power amplifier as claimed in claim 10 wherein the respective output stage voltages are substantially symmetrical.

14. A power amplifier as claimed in claim 10 wherein said digital pulse width modulator operates said bridge circuit in a first diagonal mode, a lower free-running mode, a second diagonal mode and an upper free-running mode in sequence in a plurality of operating cycles of said output stage produced by said output stage switch clock.

* * * * *